United States Patent
Duan et al.

(10) Patent No.: US 11,150,362 B2
(45) Date of Patent: Oct. 19, 2021

(54) PIXEL CIRCUIT AND METHOD FOR CONTROLLING THE SAME, AND FLAT PANEL DETECTOR

(71) Applicants: Beijing BOE Technology Development Co., Ltd., Beijing (CN); BOE Technology Group Co., Ltd., Beijing (CN)

(72) Inventors: Liye Duan, Beijing (CN); Yanzhao Li, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 70 days.

(21) Appl. No.: 16/548,206

(22) Filed: Aug. 22, 2019

(65) Prior Publication Data

US 2020/0166658 A1   May 28, 2020

(30) Foreign Application Priority Data

Nov. 23, 2018  (CN) .......................... 201811408213.2

(51) Int. Cl.
*G01T 1/24* (2006.01)
*H04N 5/32* (2006.01)
*H01L 27/146* (2006.01)

(52) U.S. Cl.
CPC .............. *G01T 1/247* (2013.01); *H04N 5/32* (2013.01); *H01L 27/14659* (2013.01)

(58) Field of Classification Search
None
See application file for complete search history.

(56) References Cited

U.S. PATENT DOCUMENTS

| 6,690,000 B1* | 2/2004 | Muramatsu | .......... H04N 5/3594 |
| | | | 250/208.1 |
| 7,250,970 B2* | 7/2007 | Shinohara | ......... H01L 27/14603 |
| | | | 250/208.1 |

(Continued)

FOREIGN PATENT DOCUMENTS

| CN | 101685227 A | 3/2010 |
| CN | 101888490 A | 11/2010 |

(Continued)

OTHER PUBLICATIONS

First Office Action, including Search Report, for Chinese Patent Application No. 201811408213.2, dated Jul. 15, 2020, 19 pages.

*Primary Examiner* — Edwin C Gunberg
(74) *Attorney, Agent, or Firm* — Westman, Champlin & Koehler, P.A.

(57) ABSTRACT

The present disclosure discloses a pixel circuit and a method for controlling the same, and a flat panel detector. The pixel circuit includes: a plurality of pixel units arranged in an M×N array, wherein each of the pixel units is configured to sense an optical signal and generate induced current based on the sensed optical signal, where M and N are integers greater than or equal to 1; and N storage circuits connected to N columns of pixel units respectively, wherein each of the storage circuits has an input signal terminal connected to a respective column of pixel units, a control signal terminal and an output signal terminal, and is configured to receive induced current from the respective column of pixel units at the input signal terminal, store a voltage based on the received induced current, and provide the stored voltage at the output signal terminal under control of a signal at the control signal terminal.

8 Claims, 3 Drawing Sheets

(56) References Cited

U.S. PATENT DOCUMENTS

| | | |
|---|---|---|
| 8,570,416 B2 | 10/2013 | Araki et al. |
| 9,000,501 B2 | 4/2015 | Kudoh |
| 9,627,432 B2 | 4/2017 | Kudoh |
| 9,691,806 B2 | 6/2017 | Kudoh |
| 10,269,856 B2 | 8/2019 | Kudoh |
| 10,396,118 B2 | 8/2019 | Kudoh |
| 10,741,604 B2 | 8/2020 | Kudoh |
| 2007/0187609 A1 | 8/2007 | Karim |
| 2009/0309863 A1 | 12/2009 | Seto |
| 2010/0283881 A1 | 11/2010 | Araki et al. |
| 2012/0056251 A1 | 3/2012 | Kudoh |
| 2014/0014823 A1 | 1/2014 | Araki et al. |
| 2015/0179697 A1 | 6/2015 | Kudoh |
| 2016/0211300 A1 | 7/2016 | Kudoh |
| 2016/0266695 A1 | 9/2016 | Bae et al. |
| 2017/0221955 A1 | 8/2017 | Kudoh |
| 2017/0301717 A1 | 10/2017 | Kudoh |
| 2018/0096651 A1 | 4/2018 | Yamashita et al. |
| 2019/0051692 A1 | 2/2019 | Kudoh |
| 2019/0110011 A1 | 4/2019 | Araki et al. |
| 2019/0237480 A1 | 8/2019 | Cheng et al. |

FOREIGN PATENT DOCUMENTS

| | | | |
|---|---|---|---|
| CN | 105789231 A | 7/2016 | |
| CN | 107589607 A | 1/2018 | |
| CN | 108010955 A | 5/2018 | |
| CN | 108182901 A | 6/2018 | |
| CN | 108320690 A | 7/2018 | |

\* cited by examiner

PIXEL CIRCUIT AND METHOD FOR CONTROLLING THE SAME, AND FLAT PANEL DETECTOR

CROSS-REFERENCE TO RELATED APPLICATION(S)

This application claims priority to the Chinese Patent Application No. 201811408213.2, filed on Nov. 23, 2018, which is incorporated herein by reference in its entirety.

TECHNICAL FIELD

The present disclosure relates to the field of digital imaging technology, and more particularly, to a pixel circuit, a method for controlling a pixel circuit, and a flat panel detector.

BACKGROUND

A flat panel detector may utilize pixel units arranged in an array to sense optical signals, convert the sensed optical signals into electrical signals, and read and analyze the electrical signals to obtain information for imaging. For example, charges accumulated by a photodiode in a pixel unit is stored in a storage capacitor in the pixel unit to be read. However, an amount of charges which may be stored by the pixel unit is limited by a manufacturing process and a device size, and as the accumulated charges increase, storage capacitance in the pixel unit is easily saturated, thereby affecting the display.

SUMMARY

The embodiments of the present disclosure propose a pixel circuit and a method for controlling the same, and a flat panel detector.

According to a first aspect of the embodiments of the present disclosure, there is proposed a pixel circuit, comprising:

a plurality of pixel units arranged in an M×N array, wherein each of the pixel units is configured to sense an optical signal and generate induced current based on the sensed optical signal, where M and N are integers greater than or equal to 1; and N storage circuits connected to N columns of pixel units respectively, wherein each of the storage circuits has an input signal terminal connected to a respective column of pixel units, a control signal terminal and an output signal terminal, and is configured to receive induced current from the respective column of pixel units at the input signal terminal, store a voltage based on the received induced current, and provide the stored voltage at the output signal terminal under control of a signal at the control signal terminal.

In an example, the storage circuit comprises:

a first capacitor having a first terminal connected to the input signal terminal, and a second terminal connected to a reference signal terminal; and a first transistor having a gate connected to the control signal terminal, a first electrode connected to the first terminal of the first capacitor, and a second electrode connected to the output signal terminal.

In an example, each of the storage circuits comprises K storage sub-circuits, and the control signal terminal comprises K storage control signal terminals and K output control signal terminals, wherein a $k^{th}$ storage sub-circuit is connected to the input signal terminal, a $k^{th}$ storage control signal terminal, a $k^{th}$ output control signal terminal and the output signal terminal, and is configured to receive induced current from the respective column of pixel units at the input signal terminal, store a voltage based on the received induced current under control of a signal at the $k^{th}$ storage control signal terminal, and provide the stored voltage to the output signal terminal under control of a signal at the $k^{th}$ output control signal terminal, where K and k are both integers, K>1, and 1<k≤K.

In an example, the memory sub-circuit comprises a second capacitor, a third transistor, and a fourth transistor, wherein the third transistor has a gate connected to the storage control signal terminal, a first electrode connected to the input signal terminal, and a second electrode connected to a first terminal of the second capacitor;

the second capacitor has the first terminal connected to the second electrode of the third transistor, and a second terminal connected to a reference signal terminal; and the fourth transistor has a gate connected to the output control signal terminal, a first electrode connected to the first terminal of the second capacitor, and a second electrode connected to the output signal terminal.

In an example, K=2.

In an example, the pixel unit comprises:

a photoelectric conversion circuit configured to sense the optical signal and generate induced current based on the sensed optical signal; and an output transistor having a gate acting as a scanning signal terminal of the pixel unit, a first electrode connected to the photoelectric conversion circuit to receive the induced current generated by the photoelectric conversion circuit, and a second electrode acting as an output terminal of the pixel unit to output the induced current, wherein scanning signal terminals of each row of pixel units in the M×N array are connected to each other to receive a scanning signal for the row of pixel units, and output terminals of each column of pixel units are connected to each other to output the induced current.

In an example, the pixel unit is an active pixel unit.

In an example, the photoelectric conversion circuit comprises a photodiode, an amplification transistor, and a fifth transistor, wherein the photodiode has a first electrode connected to a reference signal terminal, and a second electrode connected to a gate of the amplification transistor;

the amplification transistor has a gate connected to a second electrode of the photodiode, a first electrode connected to a power supply signal terminal, and a second electrode connected to the first electrode of the output transistor; and the fifth transistor has a gate connected to a reset signal terminal, a first electrode connected to the power supply signal terminal, and a second electrode connected to the second electrode of the photodiode.

According to another aspect of the embodiments of the present disclosure, there is proposed a flat panel detector, comprising the pixel circuit described above.

According to yet another aspect of the embodiments of the present disclosure, there is proposed a method for controlling the pixel circuit described above, comprising:

applying scanning signals to M rows of pixel units in the M×N array, so that a respective row of pixel units senses optical signals and generates induced current based on the sensed optical signals;

applying a control signal to a control signal terminal of each of the N storage circuits, so that the storage circuit receives induced current from a respective column of pixel units, stores a voltage based on the received induced current, and provides the stored voltage to an output signal terminal of the storage circuit under control of the control signal.

In an example, each of the storage circuits comprises K storage sub-circuits, and the control signal terminal comprises K storage control signal terminals and K output control signal terminals, wherein a $k^{th}$ storage sub-circuit is connected to the input signal terminal, a $k^{th}$ storage control signal terminal, a $k^{th}$ output control signal terminal, and the output signal terminal, wherein, during the generation of induced current by an $m^{th}$ row of pixel units, the $k^{th}$ storage sub-circuit in each of the storage circuits receives induced current from a respective column of pixel units, and stores a voltage based on the received induced current under control of a signal at the $k^{th}$ storage control signal terminal; and during the generation of induced current by an $(m+i)^{th}$ row of pixel units, a $(k+i)^{th}$ storage sub-circuit in each of the storage circuits receives induced current from a respective column of pixel units, and stores a voltage based on the received induced current under control of the signal at the $(k+i)^{th}$ storage control signal terminal, and the $k^{th}$ storage sub-circuit in each of the storage circuits provides the stored voltage to the output signal terminal of the storage circuit under control of a signal at the $k^{th}$ output control signal terminal, where m, k and i are positive integers, $1 \le m+i \le M$, and $1 \le k+i \le K$.

In an example, K=2 and i=1.

BRIEF DESCRIPTION OF THE ACCOMPANYING DRAWINGS

The above and/or additional aspects and advantages of the present disclosure will become apparent and readily understood from the following description of the embodiments in conjunction with accompanying drawings, in which.

DETAILED DESCRIPTION

The embodiments of the present disclosure will be described in detail below, and examples of the embodiments are illustrated in the accompanying drawings, wherein the same or similar reference signs are used to refer to the same or similar elements or elements having the same or similar functions. The embodiments described below with reference to the accompanying drawings are illustrative, are intended to explain the present disclosure, and cannot be construed as limiting the present disclosure.

The pixel circuit, the method for controlling the same, and the flat panel detector according to the embodiments of the present disclosure will be described below with reference to the accompanying drawings.

Figure 1:
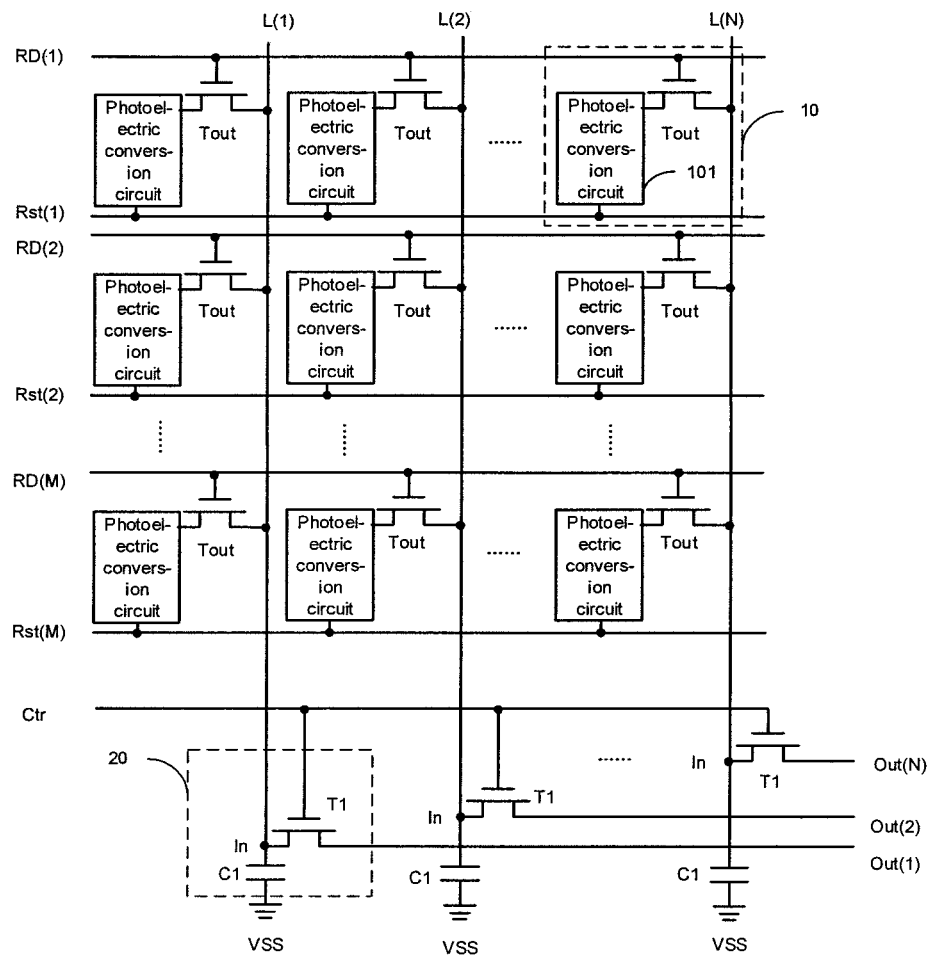
FIG. 1 is a schematic block diagram of a pixel circuit according to an embodiment of the present disclosure.

FIG. 1 is a schematic block diagram of a pixel circuit of a flat panel detector according to an embodiment of the present disclosure. As shown in FIG. 1, the pixel circuit comprises a plurality of pixel units 10 arranged in an M×N array and N storage circuits 20, where M and N are integers greater than or equal to 1.

Each of the pixel units 10 may sense an optical signal and generate induced current based on the sensed optical signal. In some embodiments, as shown in FIG. 1, each pixel unit 10 may comprise a photoelectric conversion circuit 101 and an output transistor Tout. The photoelectric conversion circuit 101 may sense an optical signal and generate induced current based on the sensed optical signal. In some embodiments, the optical signal may be X-rays which pass through an object to be imaged. The output transistor Tout has a gate acting as a scanning signal terminal of the pixel unit 10, a first electrode connected to the photoelectric conversion circuit 101 to receive the induced current generated by the photoelectric conversion circuit 101, and a second electrode acting as an output terminal of the pixel unit 10 to output the induced current. Scanning signal terminals of each row of pixel units 10 may be connected to each other to receive a scanning signal for the row of pixel units, and output terminals of each column of pixel units may be connected to each other to output induced current. For example, in FIG. 1, scanning signal terminals of a first row of pixel units 10 are connected to a scanning line RD(1) to receive a scanning signal for the first row, scanning signal terminals of a second row of pixel units 10 are connected to a scanning line RD(2) to receive a scanning signal for the second row, and so on. Output terminals of a first column of pixel units 10 are connected to a data line L(1) to output induced current on the data line L(1), output terminals of a second column of pixel units 10 are connected to a data line L(2) to output induced current on the data line L(2), and so on. When a scanning signal (from, for example, a scanning line RD(m)) for a certain row (for example, an $m^{th}$ row) of pixel units 10 is at a valid level (for example, a high level), output transistors Tout of the row of pixel units 10 are turned on, to output induced current on respective data lines L(1), L(2), ..., L(N), where m is an integer and $1 \le m \le M$.

As shown in FIG. 1, N storage circuits 20 are connected to N columns of pixel units 10 respectively. Each of the storage circuits 20 may have an input signal terminal In, a control signal terminal Ctr, and an output signal terminal Out(n), wherein the input signal terminal In is connected to a respective column of pixel units 10 (through a respective data line L(n) in FIG. 1), where $1 \le n \le N$. The storage circuit 20 may receive induced current from the respective column of pixel units at the input signal terminal In (through, for example, the data line L(n)), stores a voltage based on the received induced current, and provides the stored voltage at the output signal terminal Out(n) under control of a signal at the control signal terminal Ctr. In some embodiments, as shown in FIG. 1, the storage circuit 20 may comprise a first capacitor C1 and a first transistor T1. The first capacitor C1 has a first terminal connected to the input signal terminal In, and a second terminal connected to a reference signal terminal VSS. The first transistor T1 has a gate connected to the control signal terminal Ctr, a first electrode connected to the first terminal of the first capacitor C1, and a second electrode connected to the respective output signal terminal Out(n). The reference signal terminal VSS may be grounded or provide a constant reference potential. In this way, the capacitor C2 is connected to the respective column of multiple pixel units 10, and may store charge data generated by each pixel unit 10 in the column of pixel units 10. During scanning of an $m^{th}$ row of pixel units 10, a scanning line RD(m) is at a high level, n pixel units 10 in the $m^{th}$ row output induced current on the data lines L(1), L(2), . . . , L(N) respectively, and a first capacitor C1 in each of the storage circuits 20 is charged by induced current from a respective data line L(n), so that the induced current is converted into a voltage and is stored in the first capacitor C1. After the scanning of the $m^{th}$ row of pixel units 10 is completed, the scanning line RD(m) is at a low level, and the respective control signal terminals Ctr are at a high level, so that a first transistor T1 in each storage circuit 20 is turned on, to provide a voltage stored by a respective first capacitor C1 to a respective output signal terminal Out(n).

Each of the pixel units 10 may be in a form of any Active Pixel Sensor (APS), which is not limited. As shown in FIG. 1, each of the pixel units 10 is connected to a respective one of the data lines through a transistor (for example, a Thin Film Transistor (TFT)) or other switches, and each of the data lines is connected to a storage circuit 20. When the $m^{th}$ row of pixel units 10 is turned on, capacitors C1 in the respective storage circuits 20 are charged by the $m^{th}$ row of pixel units 10, then the $m^{th}$ row of pixel units 10 is turned off, and the charging process ends. A transistor T1 in each of the storage circuits 20 is turned on under control of a signal at a respective control signal terminal Ctr, so that an external Integrated Circuit (IC) may read out charge data (for example, voltages) stored in first capacitors C1 in the storage circuits 20 at the respective output signal terminals Out(1), Out(2), . . . , Out(N). In this way, the respective rows of pixel units 10 are sequentially turned on to complete the readout of the charge data for all the rows, so that a picture of one entire frame is read out completely. Since in the pixel circuit, one storage capacitor (i.e., a first capacitor C1) is disposed for each column of pixel units outside the array of pixel units, so that capacitance stored for the pixel units 10 is no longer limited by factors such as sizes and processes etc. of the pixel units, so as to read out a larger voltage, and reduce a signal-to-noise ratio of a signal read out by a flat panel detector, thereby improving the image quality.

In the above embodiment, each column of pixel units may share one storage capacitor. In some embodiments, two or more storage capacitors may be disposed for each column of pixel units. For example, in a case where each column of pixel units comprises 2 m rows, first m rows of pixel units share one storage capacitor, and last m rows of pixel units share the other storage capacitor, so that the two storage capacitors are connected to different rows of pixel units respectively. As another example, each column of pixel units may be connected to a plurality of storage capacitors which are connected in series, which will be described in detail hereinafter.

In the example of FIG. 1, a number of storage capacitors (i.e., first capacitors C1) may be equal to a number (i.e., N) of columns of pixel units 10, and each column of pixel units 10 corresponds to one storage capacitor. After the charging of the first capacitors C1 in all of the N storage circuits 20 by a current row (for example, the $m^{th}$ row) of pixel units 10 is completed, in each of the storage circuits 20 the first transistor T1 outputs charge data (i.e., voltage), which is generated by the current row of pixel units 10 and stored by the first capacitor C1, to respective one of the output signal terminals Out(1), Out(2), . . . , Out(N) under control of signal at the control signal terminal Ctr. Then, a next row (for example, an $(m+1)^{th}$ row) of pixel units 10 charges the respective first capacitors C1. After the charging is completed, in each of the storage circuits 20 the first transistor T1 outputs charge data (i.e., voltage), which is generated by the next row of pixel units 10 and stored by the first capacitor C1, to the respective one of the output signal terminals Out(1), Out(2), . . . , Out(N) under control of the signal at the control signal terminals Ctr.

That is, as shown in FIG. 1, when the $m^{th}$ row of pixel units 10 is turned on, the $m^{th}$ row of pixel units 10 charges the first capacitors C1 in the respective storage circuits 20. After the charging is completed, the $m^{th}$ row of pixel units 10 is turned off, and the charging by the $m^{th}$ row of pixel units 10 ends. In each of the storage circuits 20, the first transistor T1 outputs charge data, which is generated by the $m^{th}$ row of pixel units 10 and stored by the first capacitor C1, to respective one of the output signal terminals Out(1), Out(2), . . . , Out(N) under control of the signal at the control signal terminal Ctr for readout by an external IC. Then, the $(m+1)^{th}$ row of pixel units 10 is turned on to charge the first capacitors C1 in the respective storage circuits 20. After the charging is completed, the $(m+1)^{th}$ row of pixel units 10 is turned off, and the charging of the $(m+1)^{th}$ row of pixel units 10 ends. In each of the storage circuits 20, the first transistor T1 outputs charge data, which is generated by the $(m+1)^{th}$ row of pixel units 10 and stored by the first capacitor C1 to respective one of the output signal terminals Out(1), Out(2), . . . , Out(N) under control of the signal at the control signal terminal Ctr for readout by the external IC, and so on. In this way, the respective rows of pixel units 10 are sequentially turned on to complete the readout of the charge data for all the rows, so that a picture of one entire frame is read out completely.

As shown in FIG. 1, in an embodiment of the present disclosure, the pixel circuit may further comprise reset signal terminals Rst(1), Rst(2), . . . , Rst(M) (hereinafter collectively referred to as Reset signal terminals Rst) for the respective rows of pixel units 10. The reset signal terminals Rst may provide reset signals. Each row of pixel units 10 is connected to a respective reset signal terminal Rst and may be reset under control of a reset signal at the reset signal terminal Rst.

An example of a pixel unit in a pixel circuit according to an embodiment of the present disclosure will be described below with reference to FIG. 2.

Figure 2:
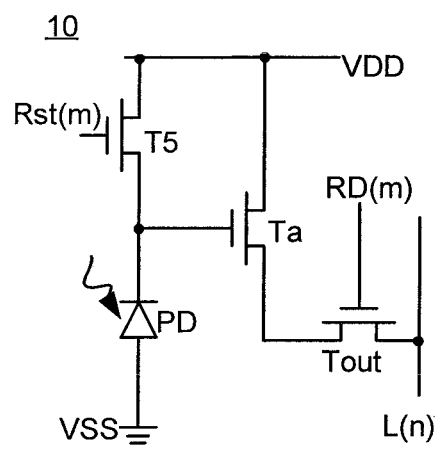
FIG. 2 is an exemplary circuit diagram of a pixel unit in the pixel circuit of FIG. 1.

FIG. 2 illustrates an exemplary circuit diagram of a pixel unit in the pixel circuit of FIG. 1. As shown in FIG. 2, the pixel unit 10 comprises a photodiode PD, an amplification transistor Ta, an output transistor Tout, and a fifth transistor T5. Hereinafter, a pixel unit 10 in an $m^{th}$ row and an $n^{th}$ column will be described as an example. The photodiode PD has a first electrode connected to a reference signal terminal VSS, and a second electrode connected to a gate of the amplification transistor Ta. The amplification transistor Ta has the gate connected to the second electrode of the photodiode PD, a first electrode connected to a power supply signal terminal VDD, and a second electrode connected to a first electrode of the output transistor Tout. The fifth transistor T5 has a gate connected to a reset signal terminal Rst(m), a first electrode connected to the power supply signal terminal VDD, and a second electrode connected to the second electrode of the photodiode PD. The output transistor Tout has a gate connected as a scanning signal terminal of the pixel unit 10 to an $m^{th}$ row of scanning line RD(m), the first electrode connected to the second electrode of the amplification transistor Ta, and a second electrode connected as an output terminal of the pixel unit 10 to an $n^{th}$ column of data line L(n).

In a storage phase, the fifth transistor T5 is turned off under action of a reset signal at the reset signal terminal Rst(m), the output transistor Tout is turned off under action of a scanning signal on the scanning line RD(m), and charges are accumulated at the gate of the amplification transistor Ta after the photodiode PD is illuminated by an optical signal, so that a voltage at the gate of the amplification transistor Ta increases or decreases.

In an output phase, the output transistor Tout is turned on under action of the scanning signal on the scanning line RD(m), the fifth transistor T5 is turned off under action of the reset signal at the reset signal terminal Rst(m), and induced current flowing through the amplification transistor Ta and the output transistor Tout is generated. This induced current may be obtained on the data line L(n).

In a reset phase, the fifth transistor T5 is turned on under action of the reset signal at the reset signal terminal Rst(m), so that the gate of the amplification transistor Ta is reset to a power supply voltage at the power supply signal terminal VDD, and the output transistor Tout is turned off under action of the scanning signal on the scanning line RD(m), so that a reset signal is output on the data line L(n) (without, for example, induced current).

Only one example of the active pixel unit 10 is given above, and the embodiments of the present disclosure are not limited thereto. The pixel unit 10 may have any other suitable structure as needed, for example, the pixel unit 10 may also be a passive pixel unit.

An operation timing of a pixel circuit according to an embodiment of the present disclosure will be described below with reference to FIG. 3.

Figure 3:
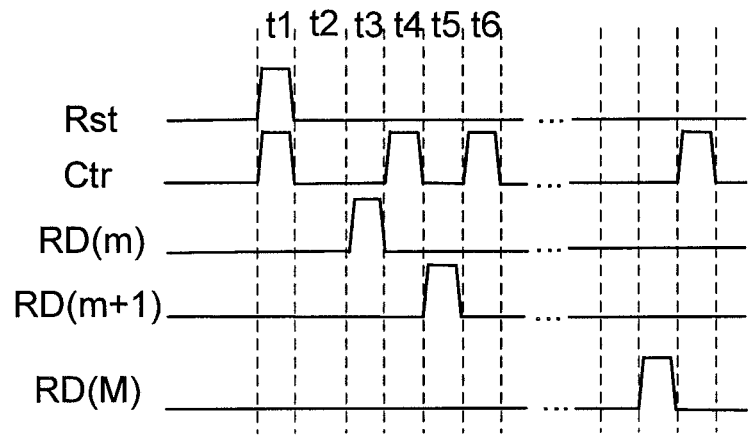
FIG. 3 is an operation timing diagram of the pixel circuit of FIG. 1.

FIG. 3 is an operation timing diagram of the pixel circuit shown in FIG. 1.

In a period t1, reset signals at reset signal terminal Rst for all the rows are at a high level, so that each pixel unit 10 is reset, for example, to output a reset signal, and control signals at control signal terminals Ctr for all the rows are at a high level, to provide the reset signals to the respective output signal terminals Out(1), Out(2), . . . , Out(N), that is, the output signal terminals of the storage circuits 20 are reset.

In a period t2, the pixel units 10 in the M×N array are illuminated by light (for example, the respective pixel units 10 in the M×N array are illuminated by X-rays which pass through the object to be imaged), and each of the pixel units 10 may generate induced current with respective magnitude according to intensity of exposure.

In a period t3, an scanning signal on the scanning line RD(m) for the $m^{th}$ row of pixel units is at a high level, and then output transistors Tout of the $m^{th}$ row of pixel units are turned on, so that first capacitors C1 in the respective storage circuits 20 are charged by induced current generated by the $m^{th}$ row of pixel units, and thereby each of the first capacitors C1 stores a voltage.

In a period t4, the scanning signal on the scanning line RD(m) becomes a low level, the charging of the first capacitor C1 in each of the storage circuits 20 ends, and the control signals at the control signal terminals Ctr are at a high level, so that the first transistor T1 in each storage circuit 20 is turned on, to provide the voltage stored by the first capacitor C1 to the respective output signal terminal Out(n) for readout by the external IC. Until now, the readout of sensed data of the $m^{th}$ row of pixel units is completed.

In a period t5, a scanning signal on a scanning line RD(m+1) for the $(m+1)^{th}$ row of pixel units is at a high level, and then the output transistors Tout of the $(m+1)^{th}$ row of pixel units are turned on, so that first capacitors C1 in the respective storage circuits 20 are charged by induced current generated by the $(m+1)^{th}$ row of pixel units, and thereby each of the first capacitors C1 stores a voltage.

In a period t6, the scanning signal on the scanning line RD(m+1) becomes a low level, the charging of the first capacitor C1 in each storage circuit 20 ends, and the control signals at the control signal terminals Ctr are at a high level, so that the first transistor T1 in each storage circuit 20 is turned on, to provide the voltage stored by the first capacitor C1 to the respective output signal terminal Out(n) for readout by the external IC. Until now, the readout of sensed data of the $(m+1)^{th}$ row of pixel units is completed.

Thereafter, the above operations are repeated for subsequent rows of pixel units 10, until the readout of all the rows is completed, to read out a picture of one entire frame completely.

In some embodiments, during the reading of charge data of capacitors by the external IC (for example, in the periods t4 and t6), the output transistors Tout in the row of pixel units 10 which generate the charge data may be turned off by using the scanning signal on the scanning line RD, so that there is no current on the respective data lines L(1), L(2), . . . , L(N), thereby preventing parasitic resistance of the switch transistors in the pixel units 10 from generating an undesired voltage drop.

A pixel circuit according to another embodiment of the present disclosure will be described below with reference to FIG. 4.

Figure 4:
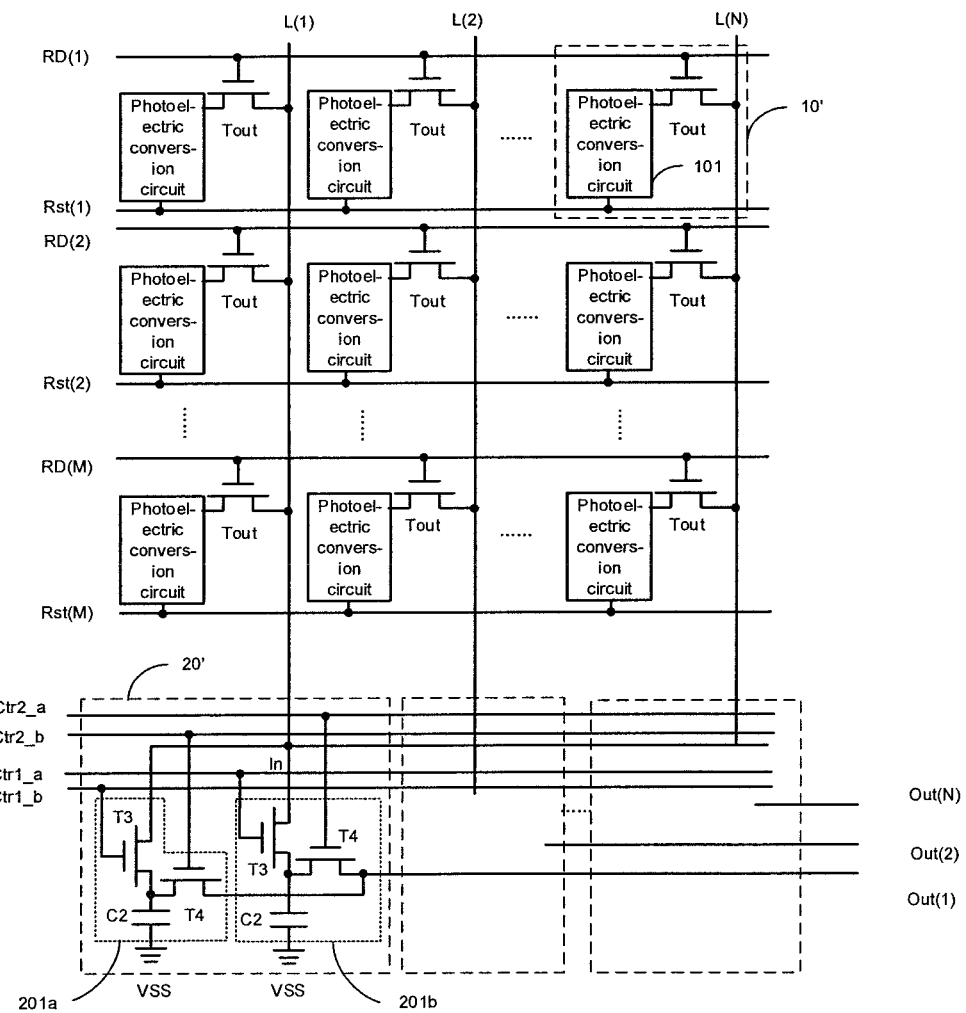
FIG. 4 is a schematic block diagram of a pixel circuit according to another embodiment of the present disclosure.

FIG. 4 is a schematic block diagram of a pixel circuit according to another embodiment of the present disclosure. The pixel circuit of FIG. 4 is similar to the pixel circuit of FIG. 1, except at least that a structure of the storage circuit 20' is different from that of the storage circuit 20' in FIG. 1. For the sake of brevity, the differences will be mainly described below.

As shown in FIG. 4, the pixel circuit comprises a plurality of pixel units 10' arranged in an M×N array and N storage circuits 20', where M and N are integers greater than or equal to 1. The pixel circuit 10' may be implemented by the pixel circuit 10 described in any of the above embodiments. Each storage circuit 20' comprises K memory sub-circuits, where K is an integer and K>1. In FIG. 4, K=2 is taken as an example, in which each storage circuit 20' comprises two memory sub-circuits 201a and 201b. A control signal terminal of each storage circuit 20' comprises K memory control signal terminals (two memory control signal terminals Crt1_a and Crt1_b in FIG. 4) and K output control signal terminals (two output control signal terminals Crt2_a and Crt2_b in FIG. 4). In each of the storage circuits 20', each of the storage sub-circuits is connected to the input signal terminal In, the output signal terminal Out, and a respective storage control signal terminal and a respective output control signal terminal of the storage circuit 20'. For example, a $k^{th}$ storage sub-circuit is connected to the input signal terminal, a $k^{th}$ storage control signal terminal, a $k^{th}$ output control signal terminal, and the output signal terminal, and may receive induced current from a respective column of pixel units at the input signal terminal, store a voltage based on the received induced current under control of a signal at the $k^{th}$ storage control signal terminal, and provide the stored voltage to the output signal terminal under control of a signal at the $k^{th}$ output control signal terminal, where k is an integer, and $1<k≤K$.

For example, in FIG. 4, a storage circuit 20' connected to the data line L(1) (i.e., for a first column of pixel units 10') is illustrated as an example, wherein the storage sub-circuit 201a is connected to the input signal terminal In, the storage control signal terminal Ctr1_a (first storage control signal terminal), the output control signal terminal Ctr2_a (first output control signal terminal), and an output signal terminal Out(1); and the storage sub-circuit 201b is connected to the input signal terminal In, the storage control signal terminal Ctr1_b (second storage control signal terminal), the output control signal terminal Ctr2_b (second output control signal terminal), and the output signal terminal Out(1).

The storage sub-circuit 201a may receive induced current from the first column of pixel units (i.e., from the data line L(1)) at the input signal terminal In, store a voltage based on the received induced current under control of a signal at the storage control signal terminal Ctr1_a, and provide the stored voltage to the output signal terminal Out(1) under control of a signal at the output control signal terminal Ctr2_a. The storage sub-circuit 201b may receive induced current from the first column of pixel units (i.e., from the data line L(1)) at the input signal terminal In, store a voltage based on the received induced current under control of a signal at the storage control signal terminal Ctr1_b, and provide the stored voltage to the output signal terminal Out(1) under control of a signal at the output control signal terminal Ctr2_b.

In FIG. 4, the storage circuit 20' connected to the data line L(1) (i.e., for the first column of pixel units 10') is illustrated as an example, wherein each of the memory sub-circuits 201a and 201b comprises a second capacitor C2, a third transistor T3 and a fourth transistor T4. The third transistor T3 has a gate connected to a respective storage control signal terminal (the storage control signal terminal Ctr1_a in the storage sub-circuit 201a, or the storage control signal terminal Ctr1_b in the storage sub-circuit 201b), a first electrode connected to the input signal terminal In (i.e., connected to the data line L(1)), and a second electrode connected to a first terminal of the second capacitor C2. The second capacitor C2 has the first terminal connected to the second electrode of the third transistor T3, and a second terminal connected to the reference signal terminal VSS. The fourth transistor T4 has a gate connected to the output control signal terminal (the output control signal terminal Ctr2_a in the storage sub-circuit 201a or the output control signal terminal Ctr2_b in the storage sub-circuit 201b), a first electrode connected to the first terminal of the second capacitor C2, an a second electrode connected to the output signal terminal Out(1).

In this way, each column of pixel units 10' may be connected to two storage capacitors (i.e., second capacitors C2). During scanning of a current row (for example, the $m^{th}$) of pixel units 10', the second capacitor C2 in the storage sub-circuit 201a is charged, and during scanning of a next row (for example, the $(m+1)^{th}$ row) of pixel units 10', the second capacitor C2 in the storage sub-circuit 201b is charged, and sensed data stored in the storage sub-circuit 201a (for example, a voltage stored in the second capacitor C2 of the storage sub-circuit 201a) may be read.

In some embodiments, in order to accelerate the operation, as shown in FIG. 3, the pixel circuit may adopt a pre-stored structure. During the charging of the second capacitor C2 in the memory sub-circuit 201b by the $m^{th}$ row of pixel units 10', the external IC may read the voltage stored in the second capacitor C2 in the storage sub-circuit 201a, and during the charging of the second capacitor C2 in the storage circuit 201a by the $(m+1)^{th}$ row of pixel units 10', the external IC may read the voltage stored in the second capacitor C2 in the storage sub-circuit 201b, and so on, to accelerate the operation using such a ping-pong operation.

Figure 5:
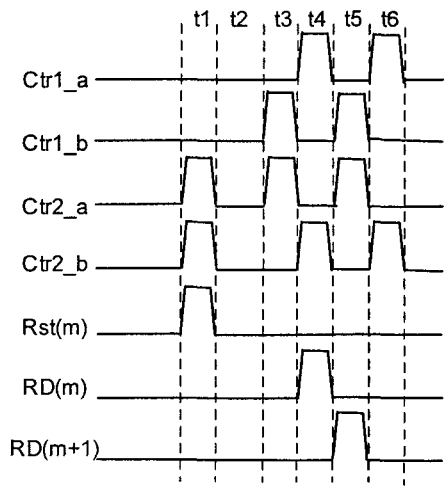
FIG. 5 is an operation timing diagram of the pixel circuit of FIG. 4.

FIG. 5 is an operation timing diagram of the pixel circuit of FIG. 4.

In a period t1, the reset signal terminals Rst of all the rows of pixel units are at a high level, to reset all the pixel units 10', and the storage control signal terminals Ctrl_a and Ctrl_b are both at a high level, so that voltages at first terminals of the second capacitor C2 in the storage sub-circuit 201a and the second capacitor C2 in the storage sub-circuit 201b are reset.

In a period t2, the pixel units 10' in the M×N array are illuminated by light (for example, the respective pixel units 10 in the M×N array are illuminated by X-rays which pass through the object to be imaged), and each of the pixel units 10' may generate induced current with respective magnitude according to intensity of exposure.

In a period t3, the storage control signal terminal Ctrl_b is at a high level, and the storage sub-circuit 201b stores charge data of the pixel unit 10' in the capacitor C2 through the third transistor T3; at the same time, the output control signal terminal Ctr2_a is at a high level, and the storage sub-circuit 201a provides charge data of the second capacitor C2 to the output signal terminal through the fourth transistor T4 for readout by an external circuit.

In a period t4, the scanning signal on the $m^{th}$ row of scanning line RD(m) is at a high level, and then the storage control signal terminal Ctrl_a is at a high level, so that the second capacitor C2 in the storage sub-circuit 201a is charged by the induced current generated by the $m^{th}$ row of pixel units 10'. During this period, the output control signal terminal Ctr2_b is at a high level, so that the storage sub-circuit 201b provides the voltage stored for an $(m-1)^{th}$ row of pixel units to the signal output terminal for readout by the external IC.

In a period t5, the scanning line RD(m) becomes a low level, and the charging of the storage circuit 20' by the $m^{th}$ row of pixel units 10' ends. The $(m+1)^{th}$ row of scanning line RD(m+1) is at a high level, and the storage control signal terminal Ctrl_b is at a high level, so that the second capacitor C2 in the storage sub-circuit 201b is charged by the induced current generated by the $(m+1)^{th}$ row of pixel units 10'. During this period, the output control signal terminal Ctr2_a is at a high level, so that the storage sub-circuit 201a provides the voltage stored for the $m^{th}$ row of pixel units in the above period t4 to the signal output terminal for readout by the external IC.

In a period t6, the scanning line RD(m+1) becomes a low level, and the charging of the storage circuit 20' by the $(m+1)^{th}$ row of pixel units 10' ends. The memory control signal terminal Ctrl_a becomes a high level, and the memory sub-circuit 201a stores the charge data of the $(m+1)^{th}$ row of pixel units 10' to the second capacitor C2 through the fourth transistor T4. During this period, the output control signal terminal Ctr2_b is at a high level, and the storage sub-circuit 201b provides the charge data of the second capacitor C2 to the output signal terminal through the fourth transistor T4 for readout by the external circuit.

Thereafter, the above operations may be repeated for subsequent rows of pixel units, until the readout of all the rows is completed, to read out a picture of one entire frame completely.

As apparent from the above, with the pixel circuit shown in FIG. 4, during the charging of the memory sub-circuit 201a by the $m^{th}$ row of pixel units 10', the external IC reads the charge data stored in the storage sub-circuit 201b, and during the charging of the memory sub-circuit 201b by the (m+1)$^{th}$ row of pixel units 10', the external IC reads the charge data stored in the storage sub-circuit 201a, and so on, to accelerate the operation using such a ping-pong operation.

It may be understood that in order to further accelerate the operation, the storage circuit may comprise more storage sub-circuits and add data lines accordingly. Since the pixel units are charged at a low speed, it is possible to have as many pixel units as possible perform the charging process at the same time. The IC reads the charges at a high speed, which may support operations of multiple rows of pixel units while reading out the charge data of these rows completely.

In the present disclosure, the transistors may be TFTs.

In the pixel circuit according to the embodiment of the present disclosure, a storage circuit is disposed for each column of pixel units to store and output charge data generated by the column of pixel units. The pixel circuit adopts column-specific storage capacitors in which storage capacitors are disposed outside an pixel array, to enable capacitance to be no longer limited by a pixel size, so that a larger amount of charges may be read out by the flat panel detector, and a signal-to-noise ratio of the signal read out by the flat panel detector is reduced, thereby improving the image quality.

Furthermore, the present disclosure further proposes a flat panel detector comprising the pixel circuit of the flat panel detector described above.

Figure 6:
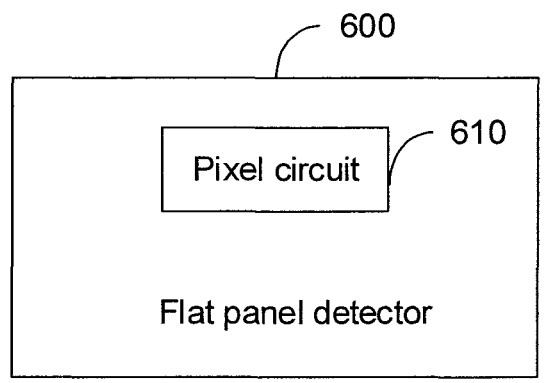
FIG. 6 is a schematic block diagram of a flat panel detector according to an embodiment of the present disclosure.

FIG. 6 is a schematic block diagram of a flat panel detector according to an embodiment of the present disclosure. As shown in FIG. 6, the flat panel detector 600 comprises a pixel circuit 610 which may be implemented by the pixel circuit according to any of the embodiments described above.

In the flat panel detector according to the embodiment of the present disclosure, with the pixel circuit described above, column-specific storage capacitors are used, wherein storage capacitors are disposed outside an pixel array, to enable capacitance to be no longer limited by a pixel size, so that a larger amount of charges may be read out by the flat panel detector, and a signal-to-noise ratio of the signal read out by the flat panel detector is reduced, thereby improving the image quality.

Figure 7:
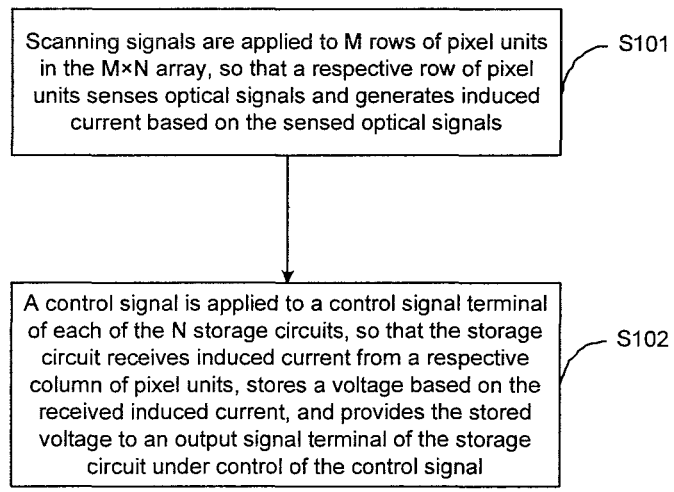
FIG. 7 is a flowchart of a method for controlling a pixel circuit according to an embodiment of the present disclosure.

FIG. 7 is a flowchart of a method for controlling a pixel circuit according to an embodiment of the present disclosure. This control method is applicable to the pixel circuit according to any of the embodiments described above.

In step S101, scanning signals are applied to M rows of pixel units in the M×N array, so that a respective row of pixel units senses optical signals and generates induced current based on the sensed optical signals.

In step S102, a control signal is applied to a control signal terminal of each of the N storage circuits, so that the storage circuit receives induced current from a respective column of pixel units, stores a voltage based on the received induced current, and provides the stored voltage to an output signal terminal of the storage circuit under control of the control signal.

In a case where the storage circuit in the pixel circuit has a plurality of storage sub-circuits, for example, the storage circuit has the structure described above with reference to FIG. 4, the above steps S101 and S102 may be performed in the manner described above with reference to FIG. 5.

For example, during the generation of induced current by an m$^{th}$ row of pixel units, the k$^{th}$ storage sub-circuit in each of the storage circuits receives induced current from a respective column of pixel units, and stores a voltage based on the received induced current under control of a signal at the k$^{th}$ storage control signal terminal; and during the generation of induced current by an (m+i)$^{th}$ row of pixel units, a (k+i)$^{th}$ storage sub-circuit in each of the storage circuits receives induced current from a respective column of pixel units, and stores a voltage based on the received induced current under control of the signal at the (k+i)$^{th}$ storage control signal terminal, and the k$^{th}$ storage sub-circuit in each of the storage circuits provides the stored voltage to the output signal terminal of the storage circuit under control of a signal at the k$^{th}$ output control signal terminal, where m, k and i are positive integers, 1≤m+i≤M, and 1≤k+i≤K.

Furthermore, the terms "first" and "second" are used for descriptive purposes only, and are not to be construed as indicating or implying relative importance or implicitly indicating a number of indicated technical features. Thus, features defined by "first" and "second" may explicitly or implicitly include least one of the features. In the description of the present disclosure, "plurality" means at least two, such as two, three, etc., unless explicitly and specifically defined otherwise.

In the present disclosure, the terms "install," "connect with," "connect to," "fix," etc. shall be understood in a broad sense unless specifically defined or stipulated otherwise. For example, they may be fixed connections, or detachable connections, or integral connections; or may be mechanical connections or electrical connections; or may be direct connections, or indirect connections through an intermediary; or may be internal connections between two elements or interactions between two elements, unless explicitly defined otherwise. Those of ordinary skill in the art can understand the specific meanings of the above terms in the present disclosure according to specific conditions.

In the description of the present specification, the description referring to the terms "one embodiment", "some embodiments", "an example", "a specific example", or "some examples" etc. means that a specific feature, structure, material or characteristics described in conjunction with the embodiment or example is included in at least one embodiment or example of the present disclosure. In the present disclosure, schematic expressions of the above terms do not necessarily have to refer to the same embodiment or example. Furthermore, the specific feature, structure, material, or characteristics described may be combined in any suitable manner in any one or more embodiments or examples. In addition, those skilled in the art can combine and merge different embodiments or examples described in the present specification and features in different embodiments or examples without conflicting with each other.

Although the embodiments of the present disclosure have been shown and described above, it can be understood that the above embodiments are exemplary and are not to be construed as limiting the present disclosure. Those of ordinary skill in the art can make changes, modifications, substitutions and variations to the above embodiments within the scope of the present disclosure.

We claim:

1. A pixel circuit, comprising:
   a plurality of pixel units arranged in an M×N array, wherein each of the pixel units is configured to sense an optical signal and generate induced current based on the sensed optical signal, where M and N are integers greater than or equal to 1; and
   N storage circuits connected to N columns of pixel units respectively, wherein each of the storage circuits has an input signal terminal connected to a respective column of pixel units, a control signal terminal and an output signal terminal, and is configured to receive induced current from the respective column of pixel units at the input signal terminal, store a voltage based on the received induced current, and provide the stored voltage at the output signal terminal under control of a signal at the control signal terminal;

wherein each of the storage circuits comprise a first storage sub-circuit and a first second store sub-circuit, and the control signal terminal comprises a first storage control signal terminal, a second storage control signal terminal, a first output control signal terminal, and a second output control signal terminal;

wherein the first storage sub-circuit comprises a second capacitor, a third transistor, and a fourth transistor, wherein the third transistor has a gate connected to the first storage control signal terminal, a first electrode connected to the input signal terminal, and a second electrode connected to a first terminal of the second capacitor; the second capacitor has a second terminal connected to a reference signal terminal; and the fourth transistor has a gate connected to the first output control signal terminal, a first electrode connected to the first terminal of the second capacitor, and a second electrode connected to the output signal terminal;

wherein the second storage sub-circuit comprises a third capacitor, a fifth transistor, and a sixth transistor, wherein the fifth transistor has a gate connected to the second storage control signal terminal, a first electrode connected to the input signal terminal, and a second electrode connected to a first terminal of the third capacitor; the third capacitor has a second terminal connected to the reference signal terminal; and the sixth transistor has a gate connected to the second output control signal terminal, a first electrode connected to the first terminal of the third capacitor, and a second electrode connected to the output signal terminal.

2. The pixel circuit according to claim 1, wherein the storage circuit comprises:

a first capacitor having a first terminal connected to the input signal terminal, and a second terminal connected to a reference signal terminal; and a first transistor having a gate connected to the control signal terminal, a first electrode connected to the first terminal of the first capacitor, and a second electrode connected to the output signal terminal.

3. The pixel circuit according to claim 1, wherein the pixel unit comprises:

a photoelectric conversion circuit configured to sense the optical signal and generate induced current based on the sensed optical signal; and an output transistor having a gate acting as a scanning signal terminal of the pixel unit, a first electrode connected to the photoelectric conversion circuit to receive the induced current generated by the photoelectric conversion circuit, and a second electrode acting as an output terminal of the pixel unit to output the induced current, wherein scanning signal terminals of each row of pixel units in the M×N array are connected to each other to receive a scanning signal for the row of pixel units, and output terminals of each column of pixel units are connected to each other to output the induced current.

4. The pixel circuit according to claim 3, wherein the pixel unit is an active pixel unit.

5. The pixel circuit according to claim 4, wherein the photoelectric conversion circuit comprises a photodiode, an amplification transistor, and a fifth transistor, wherein the photodiode has a first electrode connected to a reference signal terminal, and a second electrode connected to a gate of the amplification transistor;

the amplification transistor has a gate connected to a second electrode of the photodiode, a first electrode connected to a power supply signal terminal, and a second electrode connected to the first electrode of the output transistor; and the fifth transistor has a gate connected to a reset signal terminal, a first electrode connected to the power supply signal terminal, and a second electrode connected to the second electrode of the photodiode.

6. A flat panel detector, comprising the pixel circuit according to claim 1.

7. A method for controlling the pixel circuit according to claim 1, comprising:

applying scanning signals to M rows of pixel units in the M×N array, so that a respective row of pixel units senses optical signals and generates induced current based on the sensed optical signals;

applying a control signal to a control signal terminal of each of the N storage circuits, so that the storage circuit receives induced current from a respective column of pixel units, stores a voltage based on the received induced current, and provides the stored voltage to an output signal terminal of the storage circuit under control of the control signal.

8. The method according to claim 7, wherein each of the storage circuits comprises K storage sub-circuits, and the control signal terminal comprises K storage control signal terminals and K output control signal terminals, wherein a $k^{th}$ storage sub-circuit is connected to the input signal terminal, a $k^{th}$ storage control signal terminal, a $k^{th}$ output control signal terminal, and the output signal terminal, wherein, during the generation of induced current by an $m^{th}$ row of pixel units, the $k^{th}$ storage sub-circuit in each of the storage circuits receives induced current from a respective column of pixel units, and stores a voltage based on the received induced current under control of a signal at the $k^{th}$ storage control signal terminal; and during the generation of induced current by an $(m+i)^{th}$ row of pixel units, a $(k+i)^{th}$ storage sub-circuit in each of the storage circuits receives induced current from a respective column of pixel units, and stores a voltage based on the received induced current under control of the signal at the $(k+i)^{th}$ storage control signal terminal, and the $k^{th}$ storage sub-circuit in each of the storage circuits provides the stored voltage to the output signal terminal of the storage circuit under control of a signal at the $k^{th}$ output control signal terminal, where m, k and i are positive integers, $1 \leq m+i \leq M$, and $1 \leq k+i \leq K$.

* * * * *